(12) United States Patent
Oda et al.

(10) Patent No.: US 8,158,092 B2
(45) Date of Patent: Apr. 17, 2012

(54) IRON SILICIDE POWDER AND METHOD FOR PRODUCTION THEREOF

(75) Inventors: Kunihiro Oda, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 12/775,635

(22) Filed: May 7, 2010

(65) Prior Publication Data

US 2010/0221170 A1 Sep. 2, 2010

Related U.S. Application Data

(63) Continuation of application No. 10/527,319, filed as application No. PCT/JP2003/011150 on Sep. 1, 2003, now Pat. No. 7,740,796.

(30) Foreign Application Priority Data

Sep. 11, 2002 (JP) ................................. 2002-265478

(51) Int. Cl.
- B22F 1/00 (2006.01)
- B22F 1/02 (2006.01)
- C22C 1/04 (2006.01)
- C22C 29/12 (2006.01)
- H01F 1/00 (2006.01)
- C01B 21/068 (2006.01)
- C01B 33/06 (2006.01)
- H01L 21/44 (2006.01)

(52) U.S. Cl. .......... 423/344; 75/232; 148/306; 148/307; 148/309; 250/492.2; 419/33; 419/48; 438/685; 438/683

(58) Field of Classification Search .................... 75/232; 148/306, 307, 309; 250/492.2; 419/33, 48; 423/344; 438/685, 683

See application file for complete search history.

(56) References Cited

U.S. PATENT DOCUMENTS

| | | |
|---|---|---|
| 4,487,627 A | 12/1984 | Umemura et al. |
| 5,460,793 A | 10/1995 | Kano et al. |
| 5,618,397 A | 4/1997 | Kano et al. |
| 5,780,755 A | 7/1998 | Dunlop et al. |
| 6,259,144 B1 * | 7/2001 | Gonzalez ................ 257/412 |
| 6,267,827 B1 | 7/2001 | Shindo et al. |
| 6,485,542 B2 | 11/2002 | Shindo et al. |
| 6,582,535 B1 | 6/2003 | Suzuki et al. |
| 6,723,183 B2 | 4/2004 | Oda et al. |
| 6,986,834 B2 | 1/2006 | Irumata et al. |
| 7,217,310 B2 | 5/2007 | Yahagi et al. |
| 7,241,368 B2 | 7/2007 | Irumata et al. |
| 7,347,969 B2 | 3/2008 | Yahagi et al. |
| 7,517,515 B2 | 4/2009 | Irumata et al. |
| 7,666,245 B2 | 2/2010 | Imori et al. |
| 7,674,446 B2 | 3/2010 | Irumata et al. |
| 7,691,172 B2 | 4/2010 | Imori et al. |
| 2006/0002838 A1 | 1/2006 | Oda et al. |
| 2006/0057014 A1 | 3/2006 | Oda et al. |
| 2008/0138642 A1 | 6/2008 | Yahagi et al. |

FOREIGN PATENT DOCUMENTS

| | | |
|---|---|---|
| JP | 10-110264 A | 4/1998 |
| JP | 10-317086 A | 12/1998 |
| JP | 2000-178713 A | 6/2000 |

OTHER PUBLICATIONS

Kloc et al. "Preparation and properties of FeSi, alpha-FeSi2, and beta-FeSi2 single crystals" Journal of Alloys and Compounds 219 (1995) 93-96.*
English language Abstract of JP 05-283751 A, Oct. 29, 1993.
English language Abstract of JP 2001-274098 A, Oct. 5, 2001.
English language Abstract of JP 2000-160157 A, Jun. 13, 2000.
English language Abstract of JP 10-237671 A, Sep. 8, 1998.
English language Abstract of JP 10-012933 A, Jan. 16, 1998.
English language Abstract of JP 09-020512 A, Jan. 21, 1997.
English language Abstract of JP 07-162041 A, Jun. 23, 1995.
English language Abstract of JP 06-081076 A, Mar. 22, 1994.
Booker et al, "A New Nitride Precipitate in Iron-Silicon Alloys", Nature, vol. 184, No. 4695, pp. 1311-1312, (Oct. 24, 1959).
Helgason et al., "The Kinetics of the Phase Transition in Ferrosilicon System", M. Miglierini and D. Petridis (eds.), Mossbauer Spectroscopy in Materials Science, pp. 13-24, 1999 (month unknown).
ESPI-METALS.COM, "Fe—Material Overview", pp. 155-162, Oct. 7, 2000.

* cited by examiner

Primary Examiner — Jerry Lorengo
Assistant Examiner — Jennifer Smith
(74) Attorney, Agent, or Firm — Howson & Howson LLP

(57) ABSTRACT

Provided is iron silicide powder in which the content of oxygen as the gas component is 1500 ppm or less, and a method of manufacturing such iron silicide powder including the steps of reducing iron oxide with hydrogen to prepare iron powder, heating the iron powder and Si powder in a non-oxidizing atmosphere to prepare synthetic powder containing FeSi as its primary component, and adding and mixing Si powder once again thereto and heating this in a non-oxidizing atmosphere to prepare iron silicide powder containing $FeSi_2$ as its primary component. The content of oxygen as the gas component contained in the iron silicide powder will decrease, and the iron silicide powder can be easily pulverized as a result thereof. Thus, the mixture of impurities when the pulverization is unsatisfactory will be reduced, the specific surface area of the iron silicide powder will increase, and the density can be enhanced upon sintering the iron silicide powder.

11 Claims, No Drawings

IRON SILICIDE POWDER AND METHOD FOR PRODUCTION THEREOF

CROSS REFERENCE TO RELATED APPLICATIONS

This application is a continuation of co-pending U.S. application Ser. No. 10/527,319, which is the National Stage of International Application No. PCT/JP2003/011150, filed Sep. 1, 2003, which claims the benefit under 35 USC §119 of Japanese Application No. 2002-265478, filed Sep. 11, 2002.

BACKGROUND OF THE INVENTION

The present invention generally relates to iron silicide powder and the manufacturing method of such iron silicide powder, and in particular relates iron silicide powder suitable for the manufacture of a sputtering target to be used in forming $\beta FeSi_2$ thin film for use as an optical communication element or solar battery material having transition-type semiconductor characteristics, and the manufacturing method of such iron silicide powder.

Although silicon has been the most popular material conventionally as the LSI semiconductor material, a compound semiconductor of indium/phosphorus, gallium/arsenic or the like is being used for optical communication (LE/LED).

Nevertheless, indium has an extremely short life span as a resource, and it is said that it can only be mined for another 20 years or so. Further, arsenic is well known as an element having strong toxicity. Thus, there is no choice but to say that the optical communication semiconductor materials being widely used today have significant problems for use.

In particular, the semiconductor element of gallium/arsenic being used in cell phones with a short product-life cycle includes arsenic having strong toxicity, and this is causing a significant problem regarding the waste disposal thereof.

Under the foregoing circumstances, it has been discovered that $\beta FeSi_2$ possesses transition-type semiconductor characteristics, and is being noted as a favorable optical communication element and solar battery material. The greatest advantage of the $\beta FeSi_2$ is that the respective constituent elements are extremely abundant on earth, and that there is no danger of toxicity or the like. Thus, these materials are known as environmentally friendly materials.

Nevertheless, this $\beta FeSi_2$ is not free of problems, and, at present, technology for preparing high-quality material comparable to compound semiconductors of indium/phosphorus, gallium/arsenic or the like has not yet been established.

Currently, as technology for forming an $FeSi_2$ thin film, proposed is technology for forming $\beta FeSi_2$ by sputtering an Fe target and forming an Fe film on a Si substrate, and thereafter generating a silicide formation reaction between Si as the substrate material and the Fe film by heating the deposited Si substrate.

Nevertheless, with this method, there are problems in that since the substrate needs to be heated at a high temperature for a long period during deposition and during annealing, there will be limitations on the device design, and that it is difficult to form a thick $\beta FeSi_2$ film since the silicide formation reaction is based on the diffusion of Si from the substrate.

As a method similar to the above, proposed is a method of accumulating Fe on the Si substrate while maintaining the substrate at a temperature in which Fe and Si will react; that is, at 470° C., but this method also encounters problems similar to those described above.

Further, as another method, proposed is a method for forming a $\beta FeSi_2$ film by separately sputtering the Fe target and Si target; that is, performing co-sputtering so as to laminate several layers of the Fe layer and Si layer, and heating this to generate a silicide formation reaction.

Nevertheless, with this method, there is another problem in that the sputtering process will become complex, and it is difficult to control the uniformity of the thickness direction of the film.

Each of the foregoing methods is based on the premise of performing annealing after depositing Fe on the Si substrate, and, with these methods that require heating at high temperatures for a long period, a problem has been noted in that the $\beta FeSi_2$, which was formed in a film shape, becomes aggregated into an island shape together with the progress of annealing.

Further, with the foregoing methods, since the Fe target is a ferromagnetic body, it is difficult to perform magnetron sputtering, and it is thereby difficult to form and even film on a large substrate. Therefore, an even $\beta FeSi_2$ film with few variations in the composition resulting from the subsequent silicide formation could not be obtained.

Moreover, although a proposal of a target (mosaic target) in which Fe and Si blocks are disposed in a prescribed area ratio has also been made, since the sputtering rate of Fe or Si, whichever is sputtered, will differ considerably, it is difficult to deposit a prescribed film composition on a large substrate, and it was not possible to prevent the arcing or generation of particles at the bonding interface of Fe and Si.

Conventionally, as technology employing $FeSi_2$, technology relating to the manufacturing method of a thermoelectric material including the steps of forming capsule particles by covering the nuclear particles of FeSi particles with Si particles of a prescribed weight ratio, performing current-conduction sintering to the powder aggregate of the capsule particles, and generating an $FeSi_2$ intermetallic compound has been disclosed (e.g., refer to Japanese Patent Laid-Open Publication No. H5-283751).

Further, a manufacturing method of $\beta FeSi_2$ including a step of pulverizing and mixing raw material powder containing Fe powder and Si powder, a step of molding the pulverized and mixed powder, and a step of sintering the molded material has been disclosed (e.g., refer to Japanese Patent Laid-Open Publication No. H6-81076).

Moreover, a manufacturing method of iron silicide thermoelectric material including the steps of mixing ferrosilicon and iron powder, and subsequently performing pressure sintering thereto at a sintering temperature of 900 to 1100° C. under an inert atmosphere has been disclosed (e.g., refer to Japanese Patent Laid-Open Publication No. H7-162041).

Further, a manufacturing method of raw material powder for an $FeSi_2$ thermoelectric conversion element including the steps of mixing a prescribed amount of transition metal powder to fine powder obtained via jet mill pulverization with inert gas so as to easily obtain fine powder having a low residual oxygen content and an average grain size of several µm or less, performing spray granulation thereto with a spray dryer, and subsequently performing pressing and sintering thereto has been disclosed (e.g., refer to Japanese Patent Laid-Open Publication No. H10-12933).

Moreover, a metallic silicide luminescent material in which a β-iron silicide semiconductor element, which is a metallic silicide semiconductor particle having a grain size of the order of nanometers, is dispersed in a particle shape in the polycrystalline silicon has been disclosed (e.g., refer to Japanese Patent Laid-Open Publication No. 2000-160157).

SUMMARY OF THE INVENTION

The present invention was devised in order to overcome the foregoing problems, and an object thereof is to provide an iron silicide powder in which the content of oxygen as the gas component contained in the iron silicide powder will decrease, the iron silicide powder can be easily pulverized as a result thereof, the mixture of impurities when the pulverization is unsatisfactory will be reduced, the specific surface area of the iron silicide powder will increase, and the density can be enhanced upon sintering the iron silicide powder. Further, provided is iron silicide powder in which the thickness of the βFeSi$_2$ film can be made thick upon sputtering by the target obtained with the sintering, the generation of particles during sputtering will be reduced, a uniform and homogenous film composition can be yielded, and the sputtering characteristics will be favorable. The present invention also provides the manufacturing method of such iron silicide powder.

The present invention provides iron silicide powder, wherein the content of oxygen as the gas component is 1500 ppm or less, or 1000 ppm or less, and wherein the specific surface area is 0.15 m$^2$/g or more, or 0.6 m$^2$/g or more. The crystal structure of the powder is substantially a $\zeta_\alpha$ phase, or the primary phase is a $\zeta_\alpha$ phase. The content of impurities excluding gas components is 500 ppm or less, 50 ppm or less, or 10 ppm or less.

The present invention also provides a manufacturing method of iron silicide powder, including the steps of reducing iron oxide with hydrogen to prepare iron powder, heating the iron powder and Si powder in a non-oxidizing atmosphere to prepare synthetic powder containing FeSi as its primary component, and adding and mixing Si powder once again thereto and heating this in a non-oxidizing atmosphere. Upon reducing the iron oxide with hydrogen, iron powder having a specific surface area of 0.2 m$^2$/g or more is prepared by being reduced in a hydrogen gas stream of 600° C. or less or 500° C. of less.

DETAILED DESCRIPTION OF THE INVENTION

Although the iron silicide powder of the present invention is represented with the molecular formula of FeSi$_2$ unless otherwise specified, this includes the scope of FeSi$_X$ (X: 1.5 to 2.5).

Further, the iron silicide powder used in this description means iron silicide powder, and powder having iron silicide as its primary component and having small amounts of other additive elements, and the present invention covers all of the above.

With the iron silicide powder of the present invention, the content of oxygen as the gas component is 1500 ppm or less, and preferably 1000 ppm or less. As a result, an effect is yielded in that the amount of oxygen contained in the iron silicide sputtering target can be further reduced.

By reducing the amount of oxygen as the gas component in the target, the generation of particles during sputtering can be suppressed, and the deposition of a uniform and homogenous film component is enabled. The content of impurities excluding gas component is made to be 500 ppm or less, preferably 50 ppm, and more preferably 10 ppm in order to obtain high-purity iron silicide powder, and effects similar to those described above can be yielded thereby. Incidentally, a gas component means the element detected in a gas state upon performing quantitative analysis.

Further, the specific surface area of the iron silicide powder is made to be 0.15 m$^2$/g or more, and preferably 0.6 m$^2$/g or more. As a result, the relative density of the iron silicide target produced via sintering can be made to be 90% or more, and even 95% or more.

By using the foregoing iron silicide powder, the average crystal grain size of the target texture can be made to be 300 μm or less, or 150 μm or less, or even 75 μm or less. An iron silicate target having such a small crystal grain size can be used to manufacture a βFeSi$_2$ thin film having stable characteristics and capable of suppressing arcing or the generation of particles.

The present invention is also able to obtain iron silicide powder characterized in that the crystal structure of powder is substantially a $\zeta_\alpha$ phase, or the primary phase is a $\zeta_\alpha$ phase. Upon manufacturing a sintered body target with iron silicide powder having this kind of composition, a target in which the iron silicide target texture is also substantially a $\zeta_\alpha$ phase, or the primary phase is a $\zeta_\alpha$ phase, can be obtained.

In the case of such iron silicide target; that is, when the phase transformation to the β phase (semiconductor phase) is suppressed and the $\zeta_\alpha$ phase still remains, a stable bias current can be applied to the target, and plasma density can be increased easily, and the sputtering gas pressure can be kept low. As a result, a superior effect is yielded in that a favorable film with few gas damages can be obtained.

Upon manufacturing the iron silicide powder of the present invention, generally manufactured iron having a purity level of 3N (99.9% excluding gas components) may be subject to, for example, wet refining process (e.g., combination of ion exchange membrane, solvent extraction, organometallic complex decomposition, electrolytic refining and the like) to remove the impurities, and such raw material refined to a level of 5N (excluding gas components) may be used.

As a specific example, for instance, iron having a purity level of 3N (excluding gas components) is dissolved in hydrochloric acid and refined with the ion exchange membrane/elution method, and this high purity iron salt solution is subject to drying/oxidizing roasting (desirable to heat this in an oxygen gas stream) so as to obtain iron oxide (Fe$_2$O$_3$). As a result, high purity iron oxide having a purity level of 4 to 5N (excluding gas components) can be obtained. There is no particular limitation on the method for obtaining the foregoing high purity iron oxide.

The present invention uses such high purity iron oxide (highly purified excluding gas components) raw material, and reduces this iron oxide with hydrogen to prepare iron powder, heats the iron powder and Si powder in a non-oxidizing atmosphere to prepare synthetic powder containing FeSi as its primary component, and adds and mixes Si powder once again thereto and heats this in a non-oxidizing atmosphere to prepare iron silicide powder containing FeSi$_2$ as its primary component.

Upon reducing iron oxide with hydrogen, it is desirable to reduce this in a hydrogen gas stream of 600° C. or less, and preferably 500° C. or less to prepare iron powder having a specific surface area of 0.2 m$^2$/g or more, and to use this iron powder to manufacture the iron silicide powder. Incidentally, since much time will be required if the temperature is 400° C. or less, it is preferable that the temperature is higher than 400° C.

As described above, since the temperature can be increased while suppressing the exothermic reaction (temperature in which the liquid phase will not appear) by performing the synthesis in two stages of FeSi and then FeSi$_2$, a significant effect is yielded in that iron silicide powder having a large specific surface area (grindability is favorable, and the mixture of impurities at the time of pulverization will be reduced) and low oxygen content can be manufactured easily. Further, a sintered body target can also be manufactured with ease.

According to the above, fine powder with a high residual ratio of $\zeta_\alpha$ (also referred to as the $\alpha Fe_2Si_5$ phase or $\alpha FeSi_2$ phase) (metallic phase) can be obtained.

The fine iron silicide powder obtained as described above can be sintered and made into a target via hot pressing, hot isostatic pressing or spark plasma sintering. Upon sintering, spark plasma sintering is particularly desirable. Employing this spark plasma sintering method, the growth or crystal grains can be suppressed, and a high density, high strength target can be sintered.

Further, since sintering can be performed in a short period and this can be cooled rapidly, the phase transformation to the β phase (semiconductor phase) can be suppressed, and a target having a high residual ratio of the $\zeta_\alpha$ phase (metallic phase) can be obtained. If different phases exist in the target, the result of sputtering will differ, and this is not preferable since this will cause the generation of particles.

Predominately, when a single phase $\zeta_\alpha$ phase (metallic phase) is used, since a stable bias current can be applied to the target, plasma density can be increased easily, and the sputtering gas pressure can be kept low. Thus, a favorable film with few gas damages can be obtained.

As a result of employing the fine iron silicide powder of the present invention, it is possible to obtain a sputtering target in which the gas components can be eliminated, the generation of particles will be reduced, a uniform and homogenous film composition can be yielded, and the sputtering characteristics will be favorable.

EXAMPLES AND COMPARATIVE EXAMPLES

The present invention is now explained in detail with reference to the Examples and Comparative Examples. These Examples are merely illustrative, and the present invention shall in no way be limited thereby. In other words, the present invention shall only be limited by the scope of claim for a patent, and shall include the various modifications other than the Examples of this invention.

Example 1

Iron chloride refined in a tubular furnace formed of high purity transparent quartz was roasted, and this iron oxide was continuously reduced in a hydrogen gas stream (hydrogen flow volume of 20 liters/min) at 500° C. for approximately 3 hours to prepare iron powder.

The specific surface area (pursuant to the BET method) of this iron powder was 0.62 m²/g. This fine powder and Si powder (specific surface area of 1.6 m²/g) having a purity level of 5N were mixed at a mixing ratio of Fe:Si=1:1, and FeSi was synthesized in a vacuum at 1350° C. (less than 1410° C. where the liquid phase will appear).

Next, so as to achieve Fe:Si=1:2, the deficient Si powder was mixed and pulverized with a ball mill. This mixed and pulverized fine powder was synthesized in a vacuum at 1050° C. The specific surface area of this synthesized block was 0.6 m²/g, and it was extremely easy to pulverize the synthesized block with the ball mill. As a result of the gas analysis (LECO method), the amount of oxygen contained in this iron silicide ($FeSi_2$) powder was 820 ppm.

Further, as a result of the XRD measurement (CuK α-ray diffraction peak), the main peak (2θ=29°) of β$FeSi_2$ could not be observed.

This obtained iron silicide powder was filled in a graphite die and sintered for 2 hours with the hot pressing method at 1150° C. in a vacuum atmosphere with a surface pressure of 275 kgf/cm². The surface of the obtained sintered body was ground with a flat-surface grinding machine to remove the contamination layer on the surface thereof, and an iron silicide target of ϕ300 mm×4 mm was prepared thereby. The relative density of the obtained target was a high density of 98%, and the oxygen content of the sintered body was 520 ppm.

The hydrogen reduction temperature, specific surface area of the raw iron powder, synthesizing process (2 stages), grindability, specific surface area of the obtained iron silicide powder, oxygen content, relative density of the sintered body target, and oxygen content of the sintered body of Example 1 are respectively shown in Table 1.

TABLE 1

| | Hydrogen Reduction Temperature | Specific Surface Area of Iron | Synthesizing Process | Grindability |
|---|---|---|---|---|
| Example 1 | 500° C. | 0.62 m²/g | 2 stages | Most Favorable |
| Example 2 | 900° C. | 0.21 m²/g | 2 stages | Favorable |
| Example 3 | 650° C. | 0.47 m²/g | 2 stages | Favorable |
| Comparative Example 1 | 500° C. | 0.62 m²/g | 1 stage | Somewhat Inferior |
| Comparative Example 2 | 1000° C. | 0.08 m²/g | 2 stages | Inferior |
| Comparative Example 3 | — | 0.12 m²/g | 1 stage | Inferior |
| Comparative Example 4 | — | 0.55 m²/g | 1 stage | Inferior |
| Comparative Example 5 | — | 0.58 m²/g | 2 stages | Favorable |

| | Specific Surface Area | Oxygen Content | Relative Density | Oxygen Content in Sintered Body |
|---|---|---|---|---|
| Example 1 | 0.60 m²/g | 820 ppm | 98% | 520 ppm |
| Example 2 | 0.15 m²/g | 690 ppm | 94% | 390 ppm |
| Example 3 | 0.51 m²/g | 815 ppm | 99% | 490 ppm |
| Comparative Example 1 | 0.06 m²/g | 2500 ppm | 93% | 1900 ppm |
| Comparative Example 2 | 0.03 m²/g | 340 ppm | 89% | 370 ppm |
| Comparative Example 3 | 0.11 m²/g | 2300 ppm | 93% | 1200 ppm |
| Comparative Example 4 | 0.08 m²/g | 3200 ppm | 91% | 950 ppm |
| Comparative Example 5 | 0.44 m²/g | 4300 ppm | 96% | 3100 ppm |

Note)
—: Commercially available iron powder (purity of 5N)

Note)
1 stage = synthesizing $FeSi_2$ directly

Note)
2 stages = synthesizing FeSi → $FeSi_2$

Example 2

Iron chloride refined in a tubular furnace formed of high purity transparent quartz was roasted, and this iron oxide was continuously reduced in a hydrogen gas stream (hydrogen flow volume of 20 liters/min) at 900° C. for approximately 3 hours to prepare iron powder.

The specific surface area (pursuant to the BET method) of this iron powder was 0.21 m²/g. This fine powder and Si powder (specific surface area of 1.6 m²/g) having a purity level of 5N were mixed at a mixing ration of Fe:Si=1:1, and FeSi was synthesized in a vacuum at 1350° C. (less than 1410° C. where the liquid phase will appear).

Next, so as to achieve Fe:Si=1:2, the deficient Si powder was mixed and pulverized with a ball mill. This mixed and pulverized fine powder was synthesized in a vacuum at 1050° C. The specific surface area of this synthesized block was 0.15 m²/g, and it was extremely easy to pulverize the synthesized block with the ball mill. As a result of the gas analysis (LECO method), the amount of oxygen contained in this iron silicide ($FeSi_2$) powder was 690 ppm.

Further, as a result of the XRD measurement (CuK α-ray diffraction peak), the main peak (2θ=29°) of $\beta FeSi_2$ could not be observed.

This obtained iron silicide powder was filled in a graphite die and sintered for 2 hours with the hot pressing method at 1150° C. in a vacuum atmosphere with a surface pressure of 275 kgf/cm². The surface of the obtained sintered body was ground with a flat-surface grinding machine to remove the contamination layer on the surface thereof, and an iron silicide target of φ300 mm×4 mm was prepared thereby. The relative density of the obtained target was a high density of 94%, and the oxygen content of the sintered body was 390 ppm.

The hydrogen reduction temperature, specific surface area of the raw iron powder, synthesizing process (2 stages), grindability, specific surface area of the obtained iron silicide powder, oxygen content, relative density of the sintered body target, and oxygen content of the sintered body of Example 2 are respectively shown in Table 1.

Example 3

Iron chloride refined in a tubular furnace formed of high purity transparent quartz was roasted, and this iron oxide was continuously reduced in hydrogen gas steam (hydrogen flow volume of 20 liters/min) at 650° C. for approximately 3 hours to prepare iron powder.

The specific surface area (pursuant to the BET method) of this iron powder was 0.45 m²/g. This fine powder and Si powder (specific surface area of 1.6 m²/g) having a purity level of 5N were mixed at a mixing ratio of Fe:Si=1.1, and FeSi was synthesized in a vacuum at 1350° C. (less than 1410° C. where the liquid phase will appear).

Next, so as to achieve Fe:Si=1:2, the deficient Si powder was mixed and pulverized with a ball mill. This mixed and pulverized fine powder was synthesized in a vacuum at 1050° C. The specific surface area of this synthesized block was 0.51 m²/g, and it was extremely east to pulverize the synthesized block with the ball mill. As a result of the gas analysis (LECO method), the amount of oxygen contained in this iron silicide ($FeSi_2$) powder was 815 ppm.

Further, as a result of the XRD measurement (CuK α-ray diffraction peak), the main peak (2θ=29°) of $\beta FeSi_2$ could not be observed.

This obtained iron silicide powder was filled in a graphite die and sintered for 2 hours with the hot pressing method at 1150° C. in a vacuum atmosphere with a surface pressure of 275 kgf/cm². The surface of the obtained sintered body was ground with a flat-surface grinding machine to remove the contamination layer on the surface thereof, and an iron silicide target of φ300 mm×4 mm was prepared thereby. The relative density of the obtained target was a high density of 99%, and the oxygen content of the sintered body was 490 ppm.

The hydrogen reduction temperature, specific surface area of the raw iron powder, synthesizing process (2 stages), grindability, specific surface area of the obtained iron silicide powder, oxygen content, relative density of the sintered body target, and oxygen content of the sintered body of Example 3 are respectively shown in Table 1.

Comparative Example 1

Iron chloride refined in a tubular furnace formed of high purity transparent quartz was roasted, and this iron oxide was continuously reduced in hydrogen gas stream (hydrogen flow volume of 20 liters/min) at 500° C. for approximately 3 hours to prepare iron powder.

The specific surface area (pursuant to the BET method) of the iron powder was 0.6 m²/g. This fine powder and Si powder (specific surface area of 1.6 m²/g) having a purity level of 5N were mixed at a mixing ratio of Fe:Si=1:2, and $FeSi_2$ was synthesized in one stage in a vacuum at 1050° C. (less than 1410° C. where the liquid phase will appear).

The specific surface area of this synthesized block was 0.06 m²/g, and it was not easy to pulverize synthesized block with the ball mill. As a result of the gas analysis (LECO method), the amount of oxygen contained in this iron silicide ($FeSi_2$) powder was of a high level at 2500 ppm.

This obtained iron silicide powder was filled in a graphite die and sintered for 2 hours with the hot pressing method at 1150° C. in a vacuum atmosphere with a surface pressure of 275 kgf/cm². The surface of the obtained sintered body was ground with a flat-surface grinding machine to remove the contamination layer on the surface thereof, and an iron silicide target of φ300 mm×4 mm was prepared thereby. The relative density of the obtained target was 93%, and the oxygen content of the sintered body was of a high level at 1900 ppm.

The hydrogen reduction temperature, specific surface area of the raw iron powder, synthesizing process (1 stage), grindability, specific surface area of the obtained iron silicide powder, oxygen content, relative density of the sintered body target, and oxygen content of the sintered body of Comparative Example 1 are respectively shown in Table 1.

Comparative Example 2

Iron chloride refined in a tubular furnace formed of high purity transparent quartz was roasted, and this iron oxide was continuously reduced in a hydrogen gas stream (hydrogen flow volume of 20 liters/min) at 1000° C. for approximately 3 hours to prepare iron powder.

The specific surface area (pursuant to the BET method) of this iron powder was 0.08 m²/g. This fine powder and Si powder (specific surface area of 1.6 m²/g) having a purity level of 5N were mixed at a mixing ratio of Fe:Si=1:1, and FeSi was synthesized in a vacuum at 1350° C. (less than 1410° C. where the liquid phase will appear).

Next, so as to achieve Fe:Si=1:2, the deficient Si powder was mixed and pulverized with a ball mill. The mixed and pulverized fine powder was synthesized in a vacuum at 1050° C. The specific surface area of the synthesized block was 0.03 m²/g, and the pulverization with the ball mill was inferior. As a result of the gas analysis (LECO method), the amount of oxygen contained in this iron silicide ($FeSi_2$) powder was low at 340 ppm.

This obtained iron silicide powder was filled in a graphite die and sintered for 2 hours with the hot pressing method at 1150° C. in a vacuum atmosphere with a surface pressure of 275 kgf/cm². The surface of the obtained sintered body was ground with a flat-surface grinding machine to remove the contamination layer on the surface thereof, and an iron silicide target of φ300 mm×4 mm was prepared thereby. The relative density of the obtained target was a low density of 89%, and the oxygen content of the sintered body was of a low level at 370 ppm.

The hydrogen reduction temperature, specific surface area of the raw iron powder, synthesizing process (2 stages), grindability, specific surface area of the obtained iron silicide powder, oxygen content, relative density of the sintered body target, and oxygen content of the sintered body of Comparative Example 2 are respectively shown in Table 1.

Comparative Example 3

Commercially available iron powder having a purity level of 5N was used. The specific surface area (pursuant to the BET method) of this iron powder was 0.12 m$^2$/g. This fine powder and Si powder (specific surface area of 1.6 m$^2$/g) having a purity level of 5N were mixed at a mixing ratio of Fe:Si=1:2, and FeSi$_2$ was synthesized in one stage in a vacuum at 1350° C. (less than 1410° C. where the liquid phase will appear).

The specific surface area of the synthesized block was 0.11 m$^2$/g, and the pulverization with the ball mill was inferior. As a result of the gas analysis (LECO method), the amount of oxygen contained in this iron silicide (FeSi$_2$) powder was of an extremely high level at 2300 ppm.

This obtained iron silicide powder was filled in a graphite die and sintered for 2 hours with the hot pressing method at 1150° C. in a vacuum atmosphere with a surface pressure of 275 kgf/cm$^2$. The surface of the obtained sintered body was ground with a flat-surface grinding machine to remove the contamination layer on the surface thereof, and an iron silicide target of φ300 mm×4 mm was prepared thereby. The relative density of the obtained target was 93%, and the oxygen content of the sintered body was of a high level at 1200 ppm.

The hydrogen reduction temperature, specific surface area of the raw iron powder, synthesizing process (1 stage), grindability, specific surface area of the obtained iron silicide powder, oxygen content, relative density of the sintered body target, and oxygen content of the sintered body of Comparative Example 3 are respectively shown in Table 1.

Comparative Example 4

Commercially available iron powder having a purity level of 5N was used. The specific surface area (pursuant to the BET method) of this iron powder was 0.55 m$^2$/g. This fine powder and Si powder (specific surface area of 1.6 m$^2$/g) having a purity level of 5N were mixed at a mixing ration of Fe:Si=1:2, and FeSi$_2$ was synthesized in one stage in a vacuum at 1350° C. (less than 1410° C. where the liquid phase will appear).

The specific surface area of this synthesized block was 0.8 m$^2$/g, and the pulverization with the ball mill was inferior. As a result of the gas analysis (LECO method), the amount of oxygen contained in this iron silicide (FeSi$_2$) powder was of an extremely high level at 3200 ppm.

This obtained iron silicide powder was filled in a graphite die and sintered for 2 hours with the hot pressing method at 1150° C. in a vacuum atmosphere with a surface pressure of 275 kgf/cm$^2$. The surface of the obtained sintered body was ground with a flat-surface grinding machine to remove the contamination layer on the surface thereof, and an iron silicide target of φ300 mm×4 mm was prepared thereby. The relative density of the obtained target was 91%, and the oxygen content of the sintered body was of a high level at 950 ppm.

The hydrogen reduction temperature, specific surface area of the raw iron powder, synthesizing process (1 stage), grindability, specific surface area of the obtained iron silicide powder, oxygen content, relative density of the sintered body target, and oxygen content of the sintered body of Comparative Example 4 are respectively shown in Table 1.

Comparative Example 5

Commercially available iron powder having a purity level of 5N was used. The specific surface area (pursuant to the BET method) of this iron powder was 0.58 m$^2$/g. This fine powder and Si powder (specific surface area of 1.6 m$^2$/g) having a purity level of 5N were mixed at a mixing ratio of Fe:Si=1:1, and FeSi was synthesized in a vacuum at 1350° C. (less than 1410° C. where the liquid phase will appear).

Next, so as to achieve Fe:Si=1:2, the deficient Si powder was mixed and pulverized with a ball mill. This mixed and pulverized fine powder was synthesized in a vacuum at 1050° C.

The specific surface area of this synthesized block was 0.44 m$^2$/g, and the pulverization with the ball mill was superior. As a result of the gas analysis (LECO method), the amount of oxygen contained in this iron silicide (FeSi$_2$) powder was extremely high at 4300 ppm.

This obtained iron silicide powder was filled in a graphite die and sintered for 2 hours with the hot pressing method at 1150° C. in a vacuum atmosphere with a surface pressure of 275 kgf/cm$^2$. The surface of the obtained sintered body was ground with a flat-surface grinding machine to remove the contamination layer on the surface thereof, and an iron silicide target of φ300 mm×4 mm was prepared thereby. The relative density of the obtained target was 96%, and the oxygen content of the sintered body was of a high level at 3100 ppm.

The hydrogen reduction temperature, specific surface area of the raw iron powder, synthesizing process (2 stages), grindability, specific surface area of the obtained iron silicide powder, oxygen content, relative density of the sintered body target, and oxygen content of the sintered body of Comparative Example 5 are respectively shown in Table 1.

As shown in Table 1, in the Examples of the present invention, the content of oxygen as impurities in the iron silicide powder in low, and pulverization could be performed easily. Further, superior effects are yielded in that since pulverization is easy, much time will not be required for performing such pulverization, and impurities other than gas components can also be reduced. Moreover, a high density target having a large specific surface area can be obtained upon manufacturing such target via sintering. As a result, in all of the targets, the relative density was 90% or more, the average crystal grain size was 300 μm or less, the area ratio of ζ$_α$ was 70% or more, the evenness (uniformity, 3σ) of the film was favorable, the generation of particles was significantly reduced, and the sputtering characteristics were favorable.

Meanwhile, in each of the Comparative Examples, the oxygen content in the iron silicide powder was high, the ratio of βFeSi$_2$ was also high, and a target sintered with this iron silicide powder showed significant generation of particles, and a film that could be peeled easily was formed. These problems caused the deterioration of the sputtered deposition quality.

The iron silicide powder of the present invention was able to achieve superior effects in which the content of oxygen as the gas component contained in the iron silicide powder will decrease, the iron silicide powder can be easily pulverized as a result thereof, the mixture of impurities when the pulverization is unsatisfactory will be reduced, the specific surface area of the iron silicide powder will increase, and the density can be enhanced upon sintering the iron silicide powder. Further, the thickness of the sputtering film; that is, the βFeSi$_2$ film obtained with the sintered body target obtained from the iron silicide powder of the present invention can be made thick, the generation of particles during sputtering will be reduced, a uniform and homogenous film composition can be yielded, and the sputtering characteristics will be favorable. The present invention yields a superior effect in that it is able to obtain iron silicide powder capable of stably producing such a sputtering target, as well as the manufacturing method thereof.

We claim:

1. An iron silicide powder having oxygen content as a gas component of 1500 ppm or less, a content of impurities excluding gas components of 500 ppm or less, a specific surface area of at least 0.15 m$^2$/g, and a crystal structure that is substantially a $\zeta_\alpha$ phase or that has a primary phase that is a $\zeta_\alpha$ phase.

2. An iron silicide powder according to claim 1, wherein said specific surface area is at least 0.6 m$^2$/g.

3. An iron silicide powder according to claim 1, wherein said powder consists of FeSi$_X$ powder, where X equals 1.5 to 2.5.

4. An iron silicide powder according to claim 3, wherein said content of impurities excluding gas components is 50 ppm or less.

5. An iron silicide powder according to claim 3, wherein said content of impurities excluding gas components is 10 ppm or less.

6. An iron silicide powder according to claim 1, wherein said powder contains FeSi$_2$ as its primary component and said crystal structure is a single phase $\zeta_\alpha$ phase.

7. An iron silicide powder having an oxygen content as a gas component of 1000 ppm or less, a content of impurities excluding gas components of 500 ppm or less, a specific surface area of at least 0.15 m$^2$/g, and a crystal structure that has a high residual ratio of $\zeta_\alpha$ phase.

8. An iron silicide powder according to claim 7, wherein said powder contains FeSi$_2$ as its primary component and said crystal structure is a single phase $\zeta_\alpha$ phase.

9. An iron silicide powder according to claim 8, wherein said specific surface area is at least 0.6 m$^2$/g.

10. An iron silicide powder according to claim 9, wherein said content of impurities excluding gas components is 50 ppm or less.

11. An iron silicide powder according to claim 9, wherein said content of impurities excluding gas components is 10 ppm or less.

* * * * *